(12) United States Patent
Kim

(10) Patent No.: US 9,666,517 B2
(45) Date of Patent: May 30, 2017

(54) SEMICONDUCTOR PACKAGES WITH A SUBSTRATE BETWEEN A PAIR OF SUBSTRATES

(71) Applicant: Yonghoon Kim, Suwon-si (KR)

(72) Inventor: Yonghoon Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/828,058

(22) Filed: Aug. 17, 2015

(65) Prior Publication Data

US 2016/0056103 A1 Feb. 25, 2016

(30) Foreign Application Priority Data

Aug. 19, 2014 (KR) .................. 10-2014-0107844

(51) Int. Cl.
*H01L 23/498* (2006.01)
*H01L 25/07* (2006.01)
*H01L 25/10* (2006.01)

(52) U.S. Cl.
CPC .. *H01L 23/49827* (2013.01); *H01L 23/49833* (2013.01); *H01L 25/074* (2013.01); *H01L 25/105* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/15311* (2013.01); *H01L 2924/181* (2013.01)

(58) Field of Classification Search
CPC ............ H01L 23/49827; H01L 25/074; H01L 23/49811; H01L 2924/15311; H01L 2924/181; H01L 2924/00012; H01L 2924/00014; H01L 2224/73265; H01L 2224/48227; H01L 2224/48091; H01L 2224/16225; H01L 2224/73204; H01L 2224/32225
USPC ........................................................ 257/774
See application file for complete search history.

(56) References Cited

U.S. PATENT DOCUMENTS

| | | |
|---|---|---|
| 5,838,061 A | 11/1998 | Kim |
| 7,217,994 B2 | 5/2007 | Zhu et al. |
| 7,537,959 B2 | 5/2009 | Lee et al. |
| 7,557,443 B2 | 7/2009 | Ye et al. |
| 7,791,205 B2 | 9/2010 | Bolken |
| 7,800,212 B2 | 9/2010 | Yoon et al. |
| 7,944,058 B2 | 5/2011 | Ishihara |
| 8,072,082 B2 | 12/2011 | Yean et al. |
| 8,159,247 B2 | 4/2012 | Gluschenkov et al. |
| 8,330,278 B2 | 12/2012 | Lee et al. |
| 8,399,297 B2 | 3/2013 | Yean et al. |

(Continued)

FOREIGN PATENT DOCUMENTS

| | | |
|---|---|---|
| KR | 20100046760 A | 5/2010 |
| KR | 20130075251 A | 7/2013 |

*Primary Examiner* — Cuong Q Nguyen
*Assistant Examiner* — Tong-Ho Kim
(74) *Attorney, Agent, or Firm* — Myers Bigel, P.A.

(57) ABSTRACT

Semiconductor packages are provided. A semiconductor package includes a first substrate including a first semiconductor chip thereon. The semiconductor package includes a second substrate on the first substrate, the second substrate including a second semiconductor chip thereon. Moreover, the semiconductor package includes a third substrate between the first and second substrates.

19 Claims, 12 Drawing Sheets

(56) References Cited

U.S. PATENT DOCUMENTS

| | | | |
|---|---|---|---|
| 2009/0166834 A1* | 7/2009 | Yoon | H01L 23/3128 |
| | | | 257/686 |
| 2011/0215451 A1* | 9/2011 | Yim | H01L 25/50 |
| | | | 257/666 |
| 2012/0267782 A1 | 10/2012 | Chen | |
| 2013/0161836 A1* | 6/2013 | Yeom | H01L 21/563 |
| | | | 257/778 |
| 2015/0221573 A1* | 8/2015 | Paek | H01L 21/568 |
| | | | 257/738 |

\* cited by examiner

SEMICONDUCTOR PACKAGES WITH A SUBSTRATE BETWEEN A PAIR OF SUBSTRATES

CROSS-REFERENCE TO RELATED APPLICATION

This U.S. non-provisional patent application claims priority under 35 U.S.C. §119 to Korean Patent Application No. 10-2014-0107844, filed on Aug. 19, 2014, in the Korean Intellectual Property Office, the entire content of which is hereby incorporated herein by reference.

BACKGROUND

The present disclosure relates to semiconductor packages. Due to advances in the electronics industry, light, small, fast electronic products can be provided to users at competitive prices. For use in electronic devices, one or more semiconductor chips may be provided in the form of a semiconductor package. Recently, a variety of technologies have been studied to improve reliability of semiconductor packages.

SUMMARY

Various embodiments of present inventive concepts provide a semiconductor package having a reduced size. Moreover, some example embodiments provide a semiconductor package in which connection terminals are disposed to have a small pitch. According to various embodiments of present inventive concepts, a semiconductor package may include a lower package including a lower substrate and a lower semiconductor chip on the lower substrate. The semiconductor package may include an interposer substrate on the lower substrate and laterally spaced apart from the lower semiconductor chip. The semiconductor package may include lower connection terminals between the lower substrate and the interposer substrate to electrically connect the lower substrate to the interposer substrate, the lower connection terminals including a first pitch. The semiconductor package may include upper connection terminals on the interposer substrate and electrically connected to the interposer substrate, the upper connection terminals including a second pitch longer than the first pitch of the lower connection terminals. Moreover, the semiconductor package may include an upper package on the interposer substrate and the lower semiconductor chip and electrically connected to the upper connection terminals, the upper package including an upper substrate and an upper semiconductor chip.

In various embodiments, the interposer substrate may include a hole penetrating therethrough, and the lower semiconductor chip may be in the hole. In some embodiments, some of the upper connection terminals form m rows that may be adjacent and parallel to a first outer side of the interposer substrate, some of the lower connection terminals form n rows that may be adjacent and parallel to the first outer side of the interposer substrate, m may be greater than or equal to n, and each of n and m may be a natural number. In some embodiments, other ones of the upper connection terminals may form a rows that are adjacent and parallel to a second outer side of the interposer substrate, other ones of the lower connection terminals may form b rows that are adjacent and parallel to the second outer side, a may be greater than or equal to b, and each of a and b may be a natural number.

According to various embodiments, the interposer substrate may include a bottom surface that is coplanar with or lower than a top surface of the lower semiconductor chip. In some embodiments, the semiconductor package may include a lower mold layer on the lower substrate to cover the lower semiconductor chip, where the lower mold layer may include a portion interposed between a sidewall of the lower semiconductor chip and an inner sidewall of the interposer substrate. Moreover, the interposer substrate may include interconnection lines electrically connecting the upper connection terminals to the lower connection terminals.

In various embodiments, when viewed in plan view, the lower semiconductor chip may be on a middle portion of the lower substrate, and the interposer substrate may be on an edge of the lower substrate. Additionally or alternatively, a first quantity of the upper connection terminals may be different from a second quantity of the lower connection terminals.

A semiconductor package, according to various embodiments, may include a lower package including a lower substrate on which a lower semiconductor chip is mounted. The semiconductor package may include an interposer substrate on the lower substrate and laterally spaced apart from the lower semiconductor chip. The semiconductor package may include an upper package on the interposer substrate and the lower semiconductor chip, the upper package including an upper substrate on which an upper semiconductor chip is mounted. The semiconductor package may include lower connection terminals on a bottom surface of the interposer substrate to electrically connect the lower substrate to the interposer substrate. Moreover, the semiconductor package may include upper connection terminals on a top surface of the interposer substrate to electrically connect the interposer substrate to the upper substrate. When viewed in plan view, the upper connection terminals may include a first arrangement different from a second arrangement of the lower connection terminals.

In various embodiments, the lower connection terminals may include a first pitch different from a second pitch of the upper connection terminals. Additionally or alternatively, the interposer substrate may include a hole penetrating the interposer substrate and connecting the top surface to the bottom surface, and the lower semiconductor chip may be in the hole.

According to various embodiments, the lower connection terminals may include first lower connection terminals that form at least one row parallel to a side of the interposer substrate, the upper connection terminals may include first upper connection terminals that form at least one row parallel to the side, the at least one row of the first upper connection terminals may include a first quantity that is equal to or greater than a second quantity of the at least one row of the first lower connection terminals, and, when viewed in plan view, the lower and upper connection terminals may be between the side of the interposer substrate and the hole.

In various embodiments, the side may be a first side of the interposer substrate, the lower connection terminals may include second lower connection terminals that are adjacent a second side of the interposer substrate, the upper connection terminals may include second upper connection terminals that are adjacent the second side, the second lower connection terminals and the second upper connection terminals may form rows parallel to the second side, and a third quantity of the rows of the second upper connection terminals may be greater than a fourth quantity of the rows of the second lower connection terminals. Moreover, the second side may be opposite the first side, or may be connected to the first side. Additionally or alternatively, a first quantity of the upper connection terminals may be different from a second quantity of the lower connection terminals.

A semiconductor package, according to various embodiments, may include a lower package including a lower substrate and a lower semiconductor chip mounted on the lower substrate. The semiconductor package may include an upper package including an upper substrate and an upper semiconductor chip mounted on the upper substrate. The semiconductor package may include an interposer substrate between the lower and upper substrates, the interposer substrate including a bottom surface including first pads thereon including a first pitch, a top surface including second pads including a second pitch longer than the first pitch of the first pads, and a hole penetrating through the interposer substrate. The semiconductor package may include first connection terminals interposed between the lower substrate and the interposer substrate to electrically connect the first pads to the lower package. Moreover, the semiconductor package may include second connection terminals interposed between the interposer substrate and the upper substrate to electrically connect the second pads to the upper package, where the lower semiconductor chip may be in the hole.

In various embodiments, the first pads and the second pads may be between a side of the interposer substrate and the hole to form rows parallel to the side, where the side connects the top surface to the bottom surface, and where a first quantity of the rows of the second pads may be equal to or greater than a second quantity of the rows of the first pads. Moreover, the interposer substrate may include interconnection lines electrically connecting respective ones of the first pads to the second pads.

A semiconductor package, according to various embodiments, may include a first substrate including a first semiconductor chip thereon. The semiconductor package may include a second substrate on the first substrate, the second substrate including a second semiconductor chip thereon. The semiconductor package may include a third substrate between the first and second substrates, the third substrate laterally spaced apart from and vertically non-overlapping with the first semiconductor chip. The semiconductor package may include a plurality of first connection terminals that electrically connect the third substrate to the first substrate. Moreover, the semiconductor package may include a plurality of second connection terminals that electrically connect the third substrate to the second substrate, where a first pitch of the plurality of first connection terminals is shorter than a second pitch of the plurality of second connection terminals.

In various embodiments, the first semiconductor chip may be in an opening in the third substrate. Moreover, the first semiconductor chip and the third substrate may be separated from the second substrate by first and second distances, respectively, where the first distance is shorter than the second distance.

According to various embodiments, the first substrate and the first semiconductor chip may define a first package, and the second substrate and the second semiconductor chip may define a second package that is on the first package and the third substrate. Moreover, the plurality of first connection terminals that electrically connect the third substrate to the first substrate may be narrower than the plurality of second connection terminals that electrically connect the third substrate to the second substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
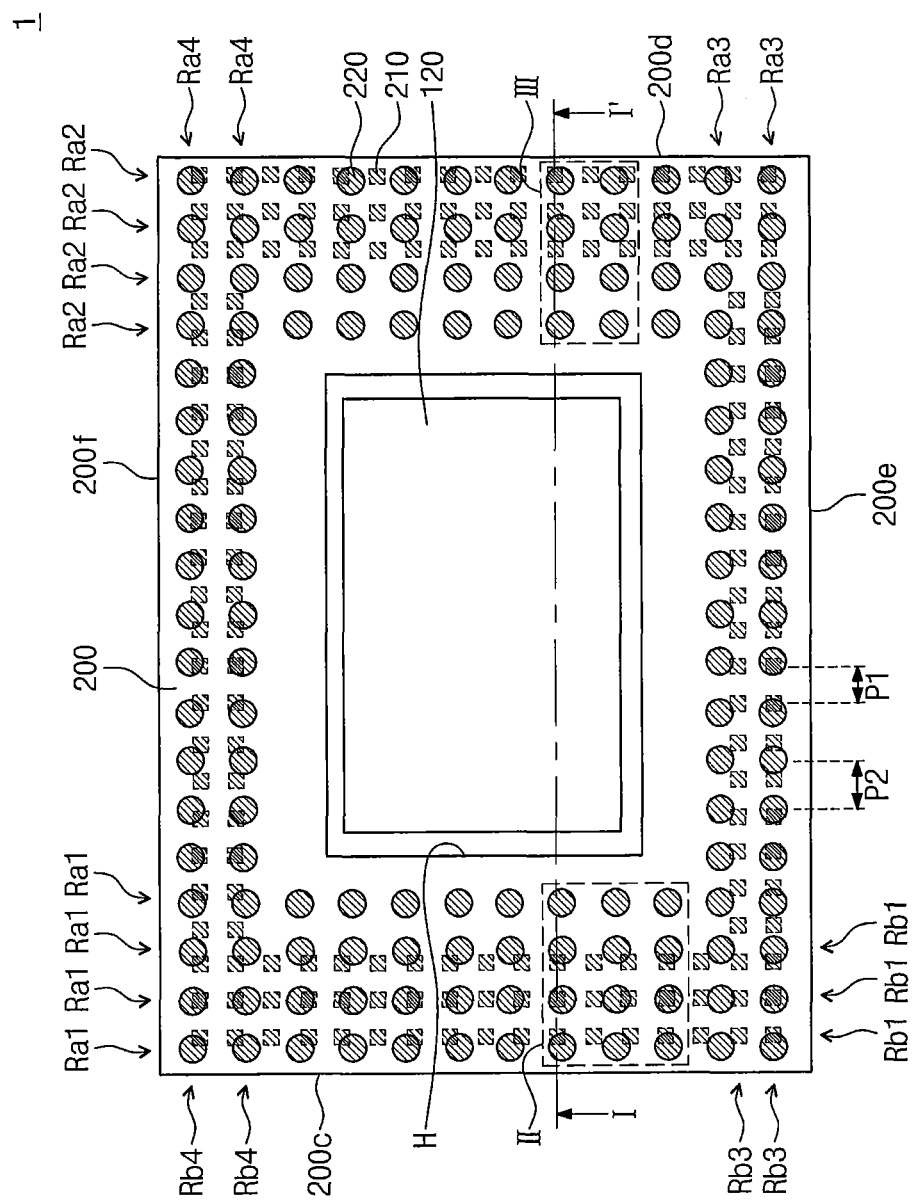
FIG. 1A is a plan view illustrating a semiconductor package according to example embodiments of present inventive concepts.

It should be noted that these figures are intended to illustrate the general characteristics of methods, structures, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
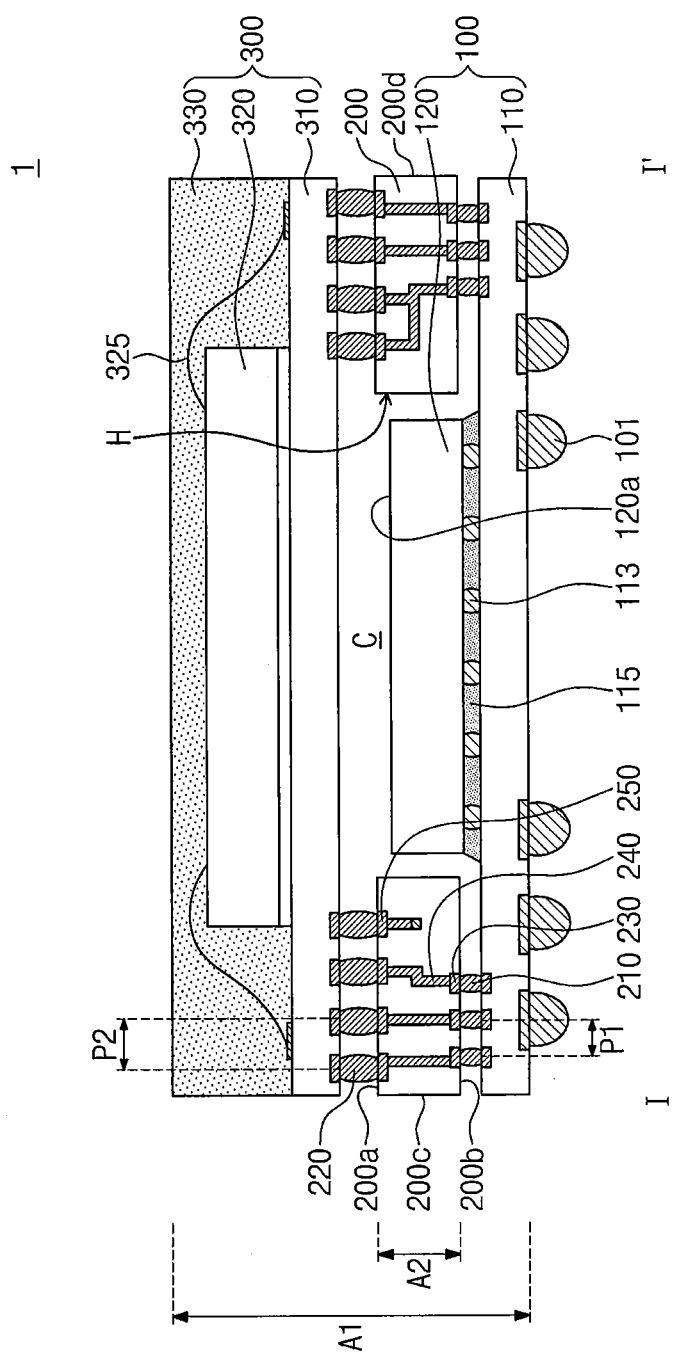
FIG. 1B is a sectional view taken along line I-I' of FIG. 1A.
Figure 1C:
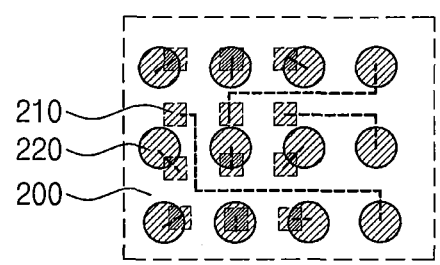
FIGS. 1C and 1D are enlarged plan views of regions II and III, respectively, of FIG. 1A.
Figure 1D:
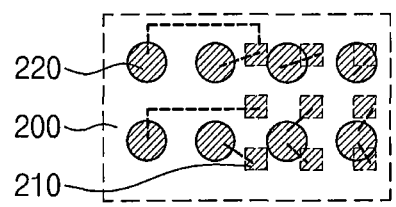

FIG. 1A is a plan view illustrating a semiconductor package according to example embodiments of present inventive concepts. FIG. 1B is a sectional view taken along line I-I' of FIG. 1A, and FIGS. 1C and 1D are enlarged plan views of regions II and III, respectively, of FIG. 1A.

Referring to FIGS. 1A and 1B, a semiconductor package 1 may include a lower package 100, an interposer substrate 200, and an upper package 300. An empty space C may be provided between the interposer substrate 200 and the upper package 300.

The lower package 100 may include a lower substrate 110 and a lower semiconductor chip 120. The lower substrate 110 may be a printed circuit board (PCB), on/in which circuit patterns are provided. Outer terminals 101 may be provided on a bottom surface of the lower substrate 110. The outer terminals 101 may include a conductive material and may be provided in the form of a solder ball. The lower substrate 110 may be electrically connected to an external device via the outer terminals 101.

As shown in FIG. 1A, the lower semiconductor chip 120 may be provided on a core (e.g., a center or middle portion) of the lower substrate 110, when viewed in a plan view. The lower semiconductor chip 120 may be mounted on a top surface of the lower substrate 110 in a flip-chip manner. Connecting portions 113 may be interposed between the lower substrate 110 and the lower semiconductor chip 120. The lower semiconductor chip 120 may be electrically connected to the lower substrate 110 via the connecting portions 113. An under fill layer 115 may be provided between the lower substrate 110 and the lower semiconductor chip 120 to fill a gap region between the connecting portions 113. Alternatively, the lower semiconductor chip 120 may be electrically connected to the lower substrate 110 via bonding wires, but the method of mounting the lower semiconductor chip 120 on the lower substrate 110 may be variously changed. The lower semiconductor chip 120 may include an integrated circuit (e.g., memory circuits, logic circuits, or combinations thereof). Configuration of the integrated circuit in/on the lower substrate 110 may be changed in consideration of a type, a mounting method, a size, and a disposition of the lower semiconductor chip 120.

The upper package 300 may include an upper substrate 310, an upper semiconductor chip 320, and an upper mold layer 330. The upper semiconductor chip 320 may include an integrated circuit (e.g., memory circuits). The upper semiconductor chip 320 may be electrically connected to the upper substrate 310 via a bonding wire 325. As another example, the upper semiconductor chip 320 may be mounted on the upper substrate 310 in a flip-chip manner. However, the upper semiconductor chip 320 may be mounted on the upper substrate 310 using various other mounting methods. In certain embodiments, one or more upper semiconductor chips 320 may be provided on the upper substrate 310. A circuit in/on the upper substrate 310 may be configured in consideration of a mounting method, a type, a size, and/or number/quantity of the upper semiconductor chip(s) 320. The upper mold layer 330 may be provided on the upper substrate 310 to cover the upper semiconductor chip 320.

The interposer substrate 200 may be interposed between the lower substrate 110 and the upper substrate 310. The interposer substrate 200 may be used to connect the upper package 300 electrically to the lower package 100. In the case where the interposer substrate 200 is provided on a top surface 120a of the lower semiconductor chip 120, a height A1 of the semiconductor package 1 may be increased by at least a height A2 of the interposer substrate 200. In example embodiments, a hole H may be provided to penetrate the interposer substrate 200, and thus, a top surface 200a and a bottom surface 200b of the interposer substrate 200 may be connected to each other through the hole H. Since the hole H is provided in the interposer substrate 200, the interposer substrate 200 may be disposed spaced apart from the lower semiconductor chip 120 in a lateral direction. As shown in FIG. 1A, when viewed in plan view, the hole H and the lower semiconductor chip 120 may at least partially overlap. The hole H may have an area larger than that of the lower semiconductor chip 120, when viewed in a plan view. The hole H may be formed at a core (e.g., center or middle portion) of the interposer substrate 200. The interposer substrate 200 may be provided on an edge of the lower substrate 110, and thus, the interposer substrate 200 may not overlap the lower semiconductor chip 120. As shown in FIG. 1B, the lower semiconductor chip 120 may be provided in the hole H to be spaced apart from the interposer substrate 200. The bottom surface 200b of the interposer substrate 200 may be positioned at a lower level than the top surface 120a of the lower semiconductor chip 120. Accordingly, when compared to the case that the interposer substrate 200 is provided on the top surface 120a of the lower semiconductor chip 120, the height A1 of the semiconductor package 1 can be reduced. For example, an increase in height of the semiconductor package 1 caused by the presence of the interposer substrate 200 may be smaller than the height A2 of the interposer substrate 200. Further, the height A2 of the interposer substrate 200 may be adjusted to control the height A1 of the semiconductor package 1. Moreover, in some embodiments, the height A1 of the semiconductor package 1 can be reduced by decreasing heights of lower connection terminals 210 and/or upper connection terminals 220. This makes it possible to reduce a size of the semiconductor package 1.

The lower connection terminals 210 may be provided between the lower substrate 110 and the interposer substrate 200 to connect the interposer substrate 200 electrically to the lower substrate 110. The lower connection terminals 210 may be provided in the form of a solder ball, a bump, or a pillar. The lower connection terminals 210 may include a conductive material (e.g., a metal). The lower connection terminals 210 may be connected to lower pads 230, respectively, which are provided on the bottom surface 200b of the interposer substrate 200.

The upper connection terminals 220 may be provided between the interposer substrate 200 and the upper substrate 310 to connect the upper substrate 310 electrically to the interposer substrate 200. The upper connection terminals 220 may be electrically connected to the lower connection terminals 210 via the interposer substrate 200. For example, upper pads 250 may be provided on the top surface 200a of the interposer substrate 200. The upper connection terminals 220 may be in contact with the upper pads 250, respectively. The upper connection terminals 220 may include a conductive material (e.g., a metal). The upper connection terminals 220 may be provided in the form of a solder ball, a bump, or a pillar. Since the hole H is provided in the interposer substrate 200 as shown in FIG. 1A, the upper connection terminals 220 may be spaced apart from the lower semiconductor chip 120, when viewed in a plan view.

Even in the case where the lower connection terminals 210 and the upper connection terminals 220 are disposed to have different respective pitches P1 and P2 and different respective arrangements, the usage of the interposer substrate 200 makes it possible to electrically connect the lower and upper connection terminals 210 and 220 to each other. For example, the upper pads 250 may be electrically connected to the lower pads 230 via at least one interconnection line 240 in the interposer substrate 200. Meanwhile, if, the interposer substrate 200 is not provided, it may be necessary to dispose the lower connection terminals 210 at the same positions as those of the upper connection terminals 220, respectively, when viewed in a plan view, to electrically connect the upper substrate 310 to the lower substrate 110. In other words, the upper connection terminals 220 should be disposed to have the same arrangement as that of the lower connection terminals 210. Alternatively, the lower and upper connection terminals 210 and 220 formed by separate processes may be omitted and connection terminals may be used to connect the upper substrate 310 to the lower substrate 110. Here, each of the connection terminals may be a single conductive pattern. In this case, the lower and upper substrates 110 and 310 may be configured to have a specific internal circuit or interconnection structure limited by the arrangement and/or pitches of connection terminals.

In example embodiments, when viewed in plan view, the upper connection terminals 220 may be differently arranged from the lower connection terminals 210, as shown in FIG. 1A. In other words, the upper connection terminals 220 may not be aligned with the lower connection terminals 210. For example, the upper connection terminals 220 may not overlap the lower connection terminals 210. A pitch P2 of the upper connection terminals 220 may be different from a pitch P1 of the lower connection terminals 210. For example, the pitch P1 of the lower connection terminals 210 may be smaller than the pitch P2 of the upper connection terminals 220. As shown in FIGS. 1C and 1D, the upper connection terminals 220 may be electrically connected to the lower connection terminals 210 via the interposer substrate 200. Dotted lines in FIGS. 1C and 1D represent such electric connections between the lower and upper connection terminals 210 and 220. Since the quantities/numbers of the lower and upper connection terminals 210 and 220 are adjusted in consideration of the configuration and/or arrangement of the interconnection lines 240 in the interposer substrate 200, the quantity/number of the upper connection terminals 220 may not be limited by the quantity/number of the lower connection terminals 210. For example, the quantity/number of the upper connection terminals 220 may be different from that of the lower connection terminals 210. Since the interconnection lines 240 of the interposer substrate 200 are used to connect the lower connection terminals 210 to the upper connection terminals 220, the lower connection terminals 210 can be formed to have a small pitch. For example, the pitch P1 of the lower connection terminals 210 may be smaller than about 0.35 nm or less. Accordingly, it is possible to reduce a technical limitation in arranging the circuits of the lower and upper substrates 110 and 310. Furthermore, it is possible to diversify the structures of the lower and upper packages 100 and 300. For example, the quantities/numbers, sizes, mounting methods, and arrangements of the upper and lower semiconductor chips 320 and 120 can be variously changed.

The lower connection terminals 210 and the upper connection terminals 220 may be in contact with the lower pads 230 and the upper pads 250, respectively. The lower pads 230 may be disposed to have a pitch corresponding or equivalent to that of the lower connection terminals 210, and the upper pads 250 may be disposed to have a pitch corresponding or equivalent to that of the upper connection terminals 220. For example, a pitch of the lower pads 230 may be smaller than that of the upper pads 250. The lower and upper pads 230 and 250 may include a conductive material (e.g., a metal).

Hereinafter, the arrangement of the connection terminals according to example embodiments of present inventive concepts will be described in more detail.

Figure 2A:
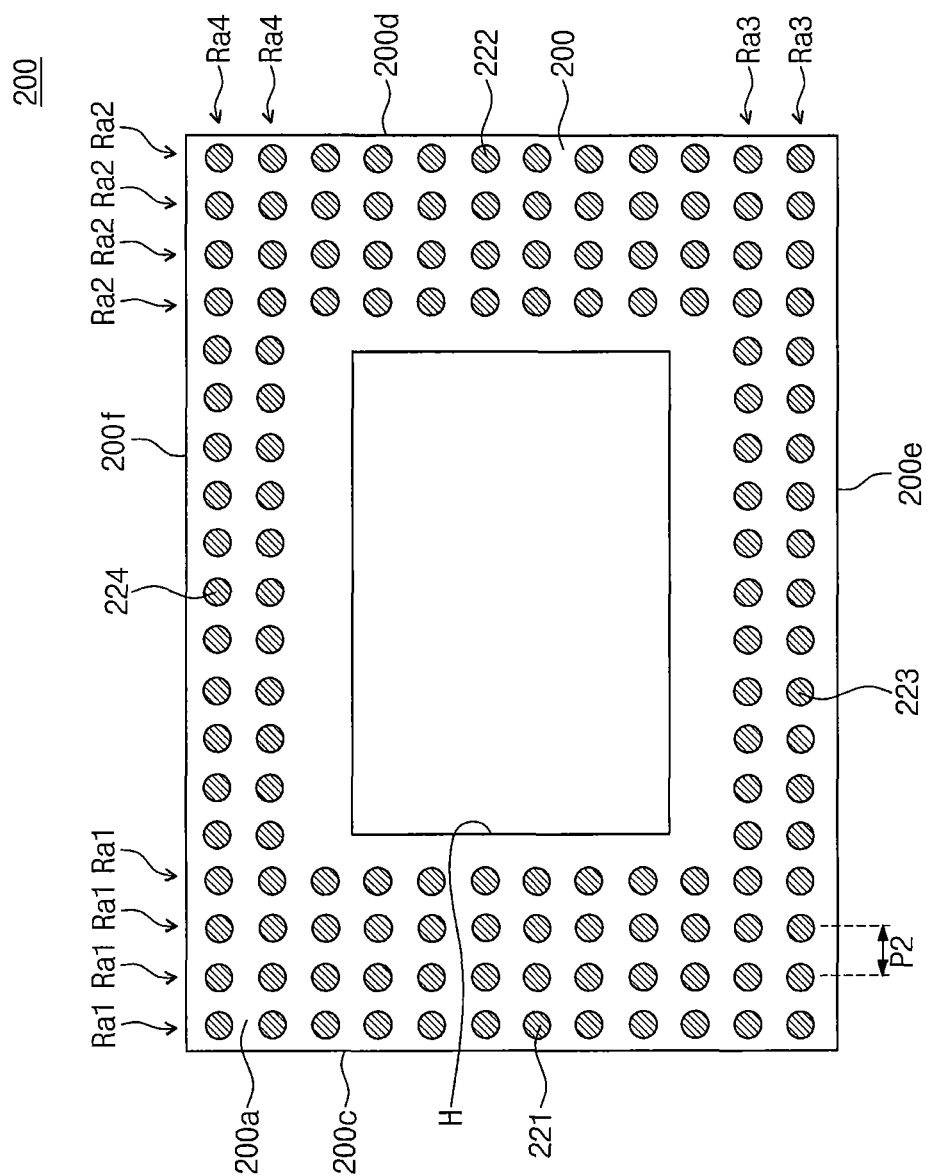
FIG. 2A is a plan view illustrating upper connection terminals provided on a top surface of an interposer substrate according to example embodiments of present inventive concepts.
Figure 2B:
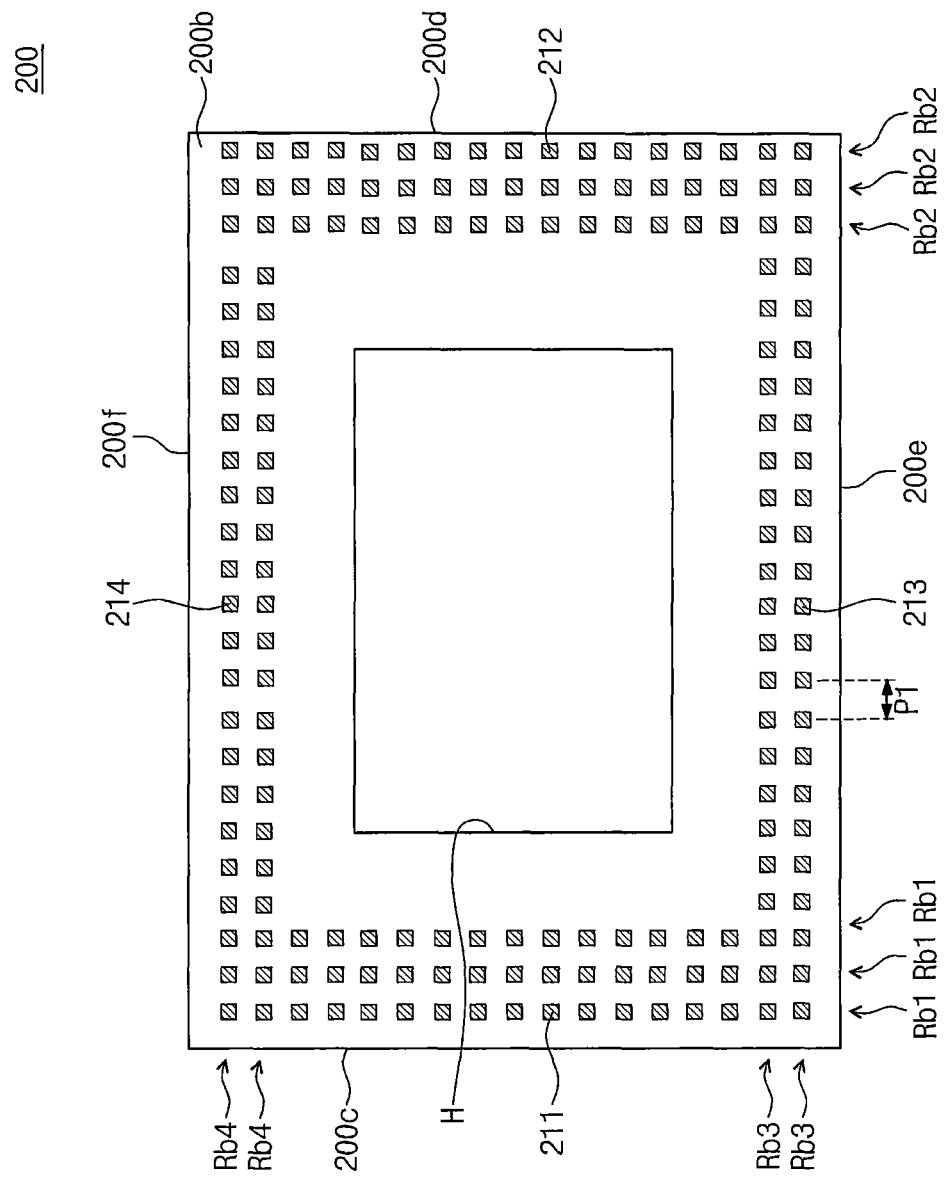
FIG. 2B is a plan view illustrating lower connection terminals provided on a bottom surface of the interposer substrate.

FIG. 2A is a plan view illustrating upper connection terminals provided on a top surface of an interposer substrate according to example embodiments of present inventive concepts, and FIG. 2B is a plan view illustrating lower connection terminals provided on a bottom surface of the interposer substrate. For the sake of brevity, the elements and features of this example that are similar to those previously shown and described may not be described further (e.g., further descriptions may be omitted) or may not be described in much further detail.

Referring to FIGS. 2A and 2B in conjunction with FIGS. 1A and 1B, the upper connection terminals 220 may be differently arranged from the lower connection terminals 210.

The lower connection terminals 210 may include first to fourth lower connection terminals 211, 212, 213, and 214. The first to fourth lower connection terminals 211, 212, 213, and 214 may be provided on the bottom surface 200b of the interposer substrate 200 and adjacent to first to fourth sides 200c, 200d, 200e, and 200f, respectively, of the interposer substrate 200. Here, the second side 200d may be opposite to the first side 200c. The third side 200e may be positioned adjacent to the first side 200c to connect the first side 200c to the second side 200d. The fourth side 200f may be opposite to the third side 200e. For example, when viewed in a plan view, the first lower connection terminals 211 may be arranged on the bottom surface 200b and between the first side 200c and the hole H. Similarly, the second to fourth lower connection terminals 212, 213, and 214 may be arranged on the bottom surface 200b of the interposer substrate 200 and between the second to fourth sides 200d, 200e, and 200f and the hole H. The first to fourth lower connection terminals 211, 212, 213, and 214 may be arranged to form rows Rb1, Rb2, Rb3, and Rb4, which are adjacent and parallel to the first to fourth sides 200c, 200d, 200e, and 200f, respectively, of the interposer substrate 200.

The upper connection terminals 220 may include first to fourth upper connection terminals 221, 222, 223, and 224. The first to fourth upper connection terminals 221, 222, 223, and 224 may be provided on the top surface 200a of the interposer substrate 200 and adjacent to the first to fourth sides 200c, 200d, 200e, and 200f, respectively. For example, when viewed in a plan view, the first to fourth upper connection terminals 221, 222, 223, and 224 may be arranged between the first to fourth sides 200c, 200d, 200e, and 200f and the hole H on the top surface 200a of the interposer substrate 200. The first to fourth upper connection terminals 221, 222, 223, and 224 may be arranged to form rows Ra1, Ra2, Ra3, and Ra4, which are adjacent and parallel to the first to fourth sides 200c, 200d, 200e, and 200f, respectively, of the interposer substrate 200. The quantity/number of the rows Ra1, Ra2, Ra3, and Ra4 may be one of 1, 2, 3, 4, and 5.

The first to fourth upper connection terminals 221, 222, 223, and 224 may not be aligned to the first to fourth lower connection terminals 211, 212, 213, and 214, respectively. For example, the rows Ra1, Ra2, Ra3, and Ra4 of the first to fourth upper connection terminals 221, 222, 223, and 224 may be different from the rows Rb1, Rb2, Rb3, and Rb4 of the first to fourth lower connection terminals 211, 212, 213, and 214 in terms of the quantity/number, position, and so forth. As an example, the quantity/number of the rows Ra1 of the first upper connection terminals 221 may be equal to or larger than that of the rows Rb1 of the first lower connection terminals 211. In the present specification, the quantity/number of rows may be one or more. For example, the first upper connection terminals 221 may be disposed to form m rows Ra1, and the first lower connection terminals 211 may be disposed to form n rows Rb1, where the number n is equal to or smaller than the number m, and each of the numbers m and n is a natural number. In example embodiments, the numbers m and n are 3 and 2, respectively.

The pitch P2 of the first upper connection terminals 221 may be larger than the pitch P1 of the first lower connection terminals 211, and thus, the quantity/number of the first upper connection terminals 221 disposed on a given area of the interposer substrate 200 may be smaller than the quantity/number of the first lower connection terminals 211. Accordingly, the quantity/number of the rows Ra1 may be greater than the number of the rows Rb1.

The quantity/number of the rows Ra2 of the second upper connection terminals 222 may be equal to or greater than that of the rows Rb2 of the second lower connection terminals 212. Here, the rows Ra2 of the second upper connection terminals 222 and the rows Rb2 of the second lower connection terminals 212 may be parallel to the second side 200d. As an example, the second upper connection terminals 222 may be disposed to form a rows Ra2, and the second lower connection terminals 212 may be disposed to form b rows Rb2, where the number b is equal to or smaller than the number a and each of the numbers a and b is a natural number. In example embodiments, the numbers a and b are 3 and 2, respectively. The quantity/number of the rows Ra3 of the third upper connection terminals 223 may be equal to or greater than the quantity/number of the rows Rb3 of the third lower connection terminals 213. For example, the third upper connection terminals 223 may be disposed to form three rows Ra3, and the third lower connection terminals 213 may be disposed to form three rows Rb3. The quantity/number of the rows Ra4 of the fourth upper connection terminals 224 may be equal to or greater than the quantity/number of the rows Rb4 of the fourth lower connection terminals 214.

Referring to FIGS. 2A and 2B in conjunction with FIG. 1B, the upper pads 250 may be disposed to have substantially the same arrangement as that of the first to fourth upper connection terminals 221, 222, 223, and 224 to be connected thereto. The lower pads 230 may be disposed to have substantially the same arrangement as that of the first to fourth lower connection terminals 211, 212, 213, and 214 to be connected thereto. For example, the lower pads 230 and the upper pads 250 may be arranged to form rows, each of which is parallel to at least one of the first to fourth sides 200c, 200d, 200e, and 200f of the interposer substrate 200. The quantity/number of rows of the upper pads 250, which are in contact with the first upper connection terminals 221, respectively, may be equal to the quantity/number of the rows Ra1 of the first upper connection terminals 221. The quantity/number of rows of the lower pads 230, which are in contact with the first lower connection terminals 211, respectively, may be equal to the quantity/number of the rows Rb1 of the first lower connection terminals 211. Accordingly, the upper pads 250 being in contact with the first upper connection terminals 221 may be arranged in such a way that the quantity/number of the rows thereof is equal to or greater than the quantity/number of the rows of the lower pads 230 being in contact with the first lower connection terminals 211.

Figure 3A:
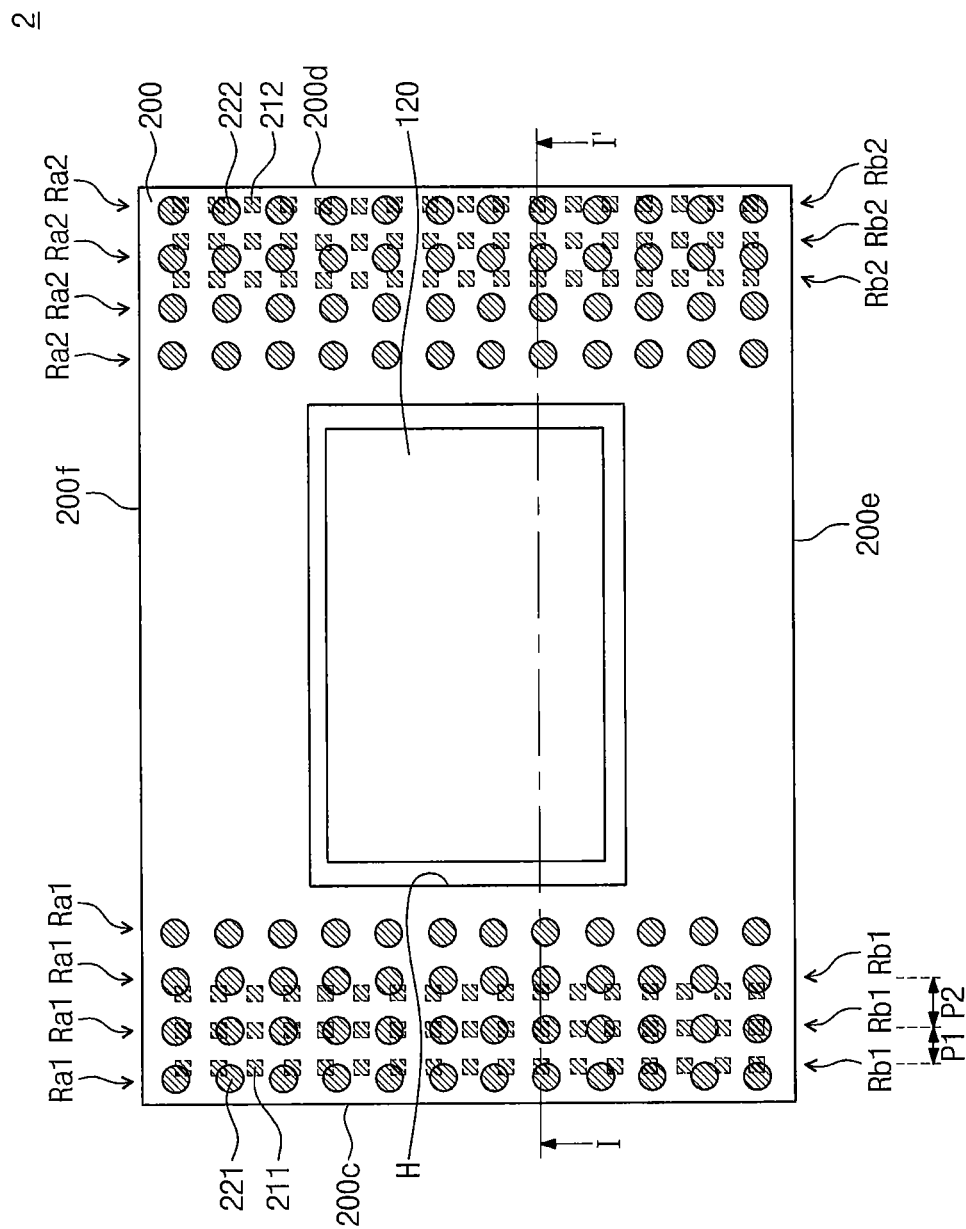
FIGS. 3A through 3C are plan views respectively illustrating semiconductor packages according to example embodiments of present inventive concepts.
Figure 3B:
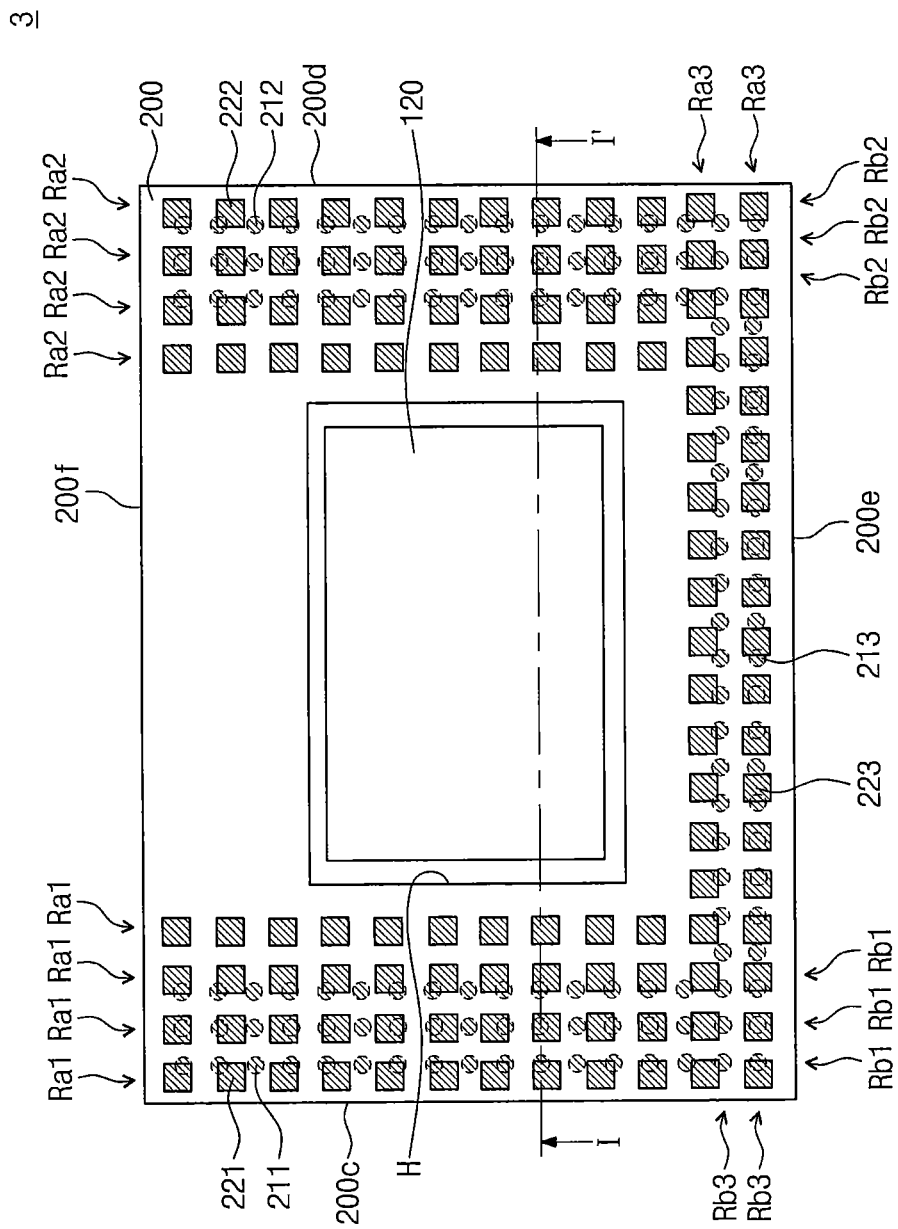
Figure 3C:
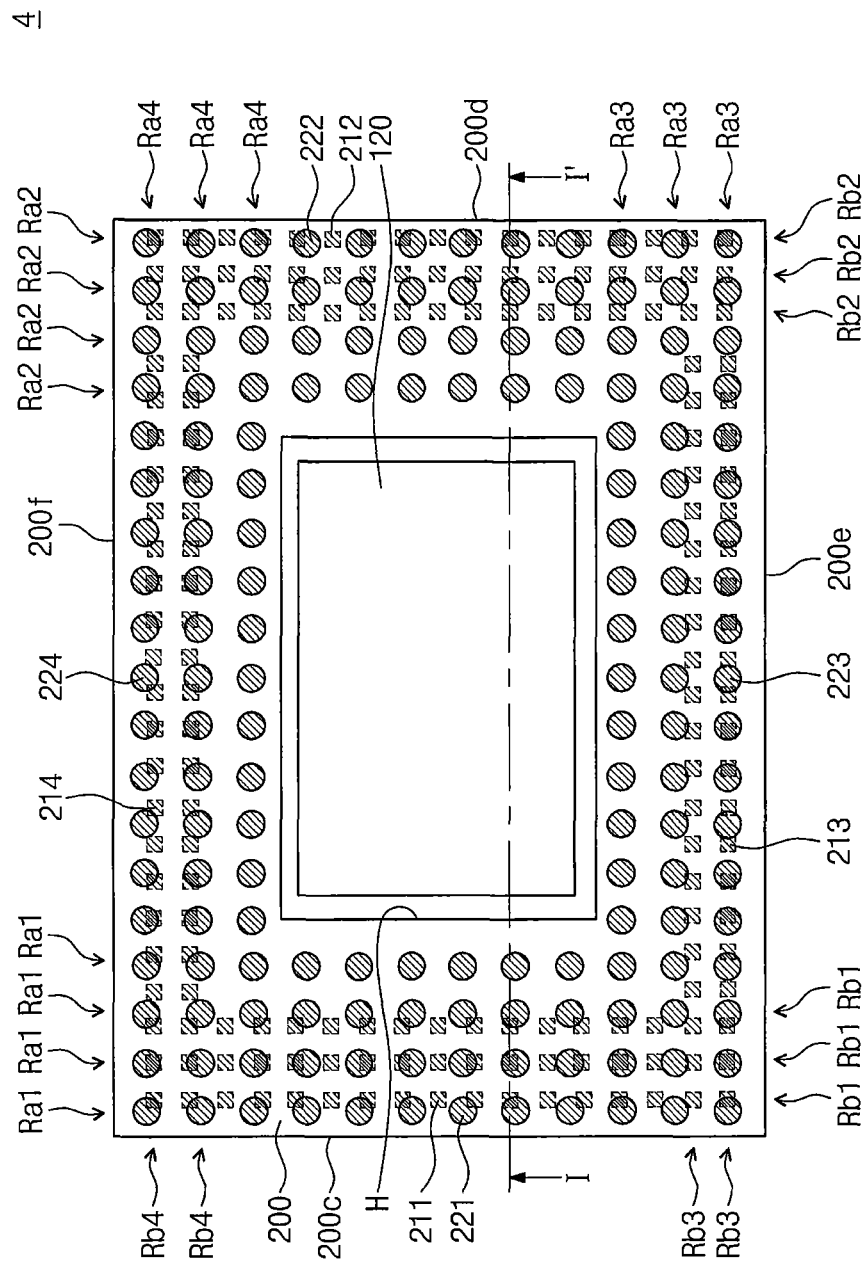

FIGS. 3A through 3C are plan views respectively illustrating semiconductor packages according to example embodiments of present inventive concepts. Sections taken along line I-I' of FIGS. 3A through 3C may be substantially the same as that of FIG. 1B. For the sake of brevity, the elements and features of this example that are similar to those previously shown and described may not be described further or in much further detail.

Referring to FIGS. 3A through 3C in conjunction with FIG. 1B, each of the semiconductor packages 2, 3, and 4 may include the lower package 100, the interposer substrate 200, and the upper package 300. The lower package 100 may include the lower substrate 110 and the lower semiconductor chip 120 previously described with reference to FIGS. 1A and 1B. The upper package 300 may include the upper substrate 310, the upper semiconductor chip 320, and the upper mold layer 330.

As shown in FIG. 3A, the connection terminals 211, 212, 221, and 222 may be formed adjacent to the first and second sides 200c and 200d of the interposer substrate 200. For example, the first and second lower connection terminals 211 and 212 may be provided on the bottom surface 200b of the interposer substrate 200, and the first and second upper connection terminals 221 and 222 may be provided on the top surface 200a of the interposer substrate 200. The semiconductor package of FIG. 3A may be configured to not include the third and fourth upper connection terminals 223 and 224 and the third and fourth lower connection terminals 213 and 214 described with reference to FIGS. 1A-1D. The quantity/number of the rows Ra1 of the first upper connection terminals 221 may be greater than that of the rows Rb1 of the first lower connection terminals 211. As another example, the quantity/number of the rows Ra1 of the first upper connection terminals 221 may be equal to that of the rows Rb1 of the first lower connection terminals 211. The quantity/number of the rows Ra1 of the second upper connection terminals 222 may be greater than that of the rows Rb2 of the second lower connection terminals 212. As another example, the quantity/number of the rows Ra2 of the second upper connection terminals 222 may be equal to that of the rows Rb2 of the second lower connection terminals 212.

Referring to FIG. 3B, the connection terminals 211, 212, 213, 221, 222, and 223 may be formed adjacent to the first to third sides 200c, 200d, and 200e of the interposer substrate 200. For example, the first to third upper connection terminals 221, 222, and 223 may be provided on the top surface 200a of the interposer substrate 200, and the first to third lower connection terminals 211, 212, and 213 may be provided on the bottom surface 200b of the interposer substrate 200. The quantity/number of the rows Ra1 of the first upper connection terminals 221 may be greater than that of the rows Rb1 of the first lower connection terminals 211. The quantity/number of the rows Ra2 of the second upper connection terminals 222 may be greater than that of the rows Rb2 of the second lower connection terminals 212. The quantity/number of the rows Ra3 of the third upper connection terminals 223 may be equal to that of the rows Rb3 of the third lower connection terminals 213.

Referring to FIG. 3C, the connection terminals 211, 212, 213, 214, 221, 222, 223, and 224 may be formed adjacent to the first to fourth sides 200c, 200d, 200e, and 200f of the interposer substrate 200. Each of the quantities/numbers of the rows Ra1, Ra2, Ra3, and Ra4, which are respectively composed of the first to fourth upper connection terminals 221, 222, 223, and 224, may be greater than a corresponding one of the quantities/numbers of the rows Rb1, Rb2, Rb3, and Rb4, which are respectively composed of the first to fourth lower connection terminals 211, 212, 213, and 214.

However, the arrangements of the upper and lower connection terminals 220 and 210 are not limited to the examples of FIGS. 3A through 3C. For example, the upper and lower connection terminals 220 and 210 may have one of other various arrangements, if only they are disposed adjacent to at least one of the first to fourth sides 200c, 200d, 200e, and 200f. Further, as an example, if the upper connection terminals 221, 222, 223, and 224 are formed adjacent to one of the first to fourth sides 200c, 200d, 200e, and 200f, the lower connection terminals 211, 212, 213, and 214 may be formed adjacent to the same side as the upper connection terminals 221, 222, 223, and 224. For example, if the first lower connection terminals 211 are formed on the interposer substrate 200, the first upper connection terminals 221 corresponding thereto may be formed on the interposer substrate 200.

Figure 4A:
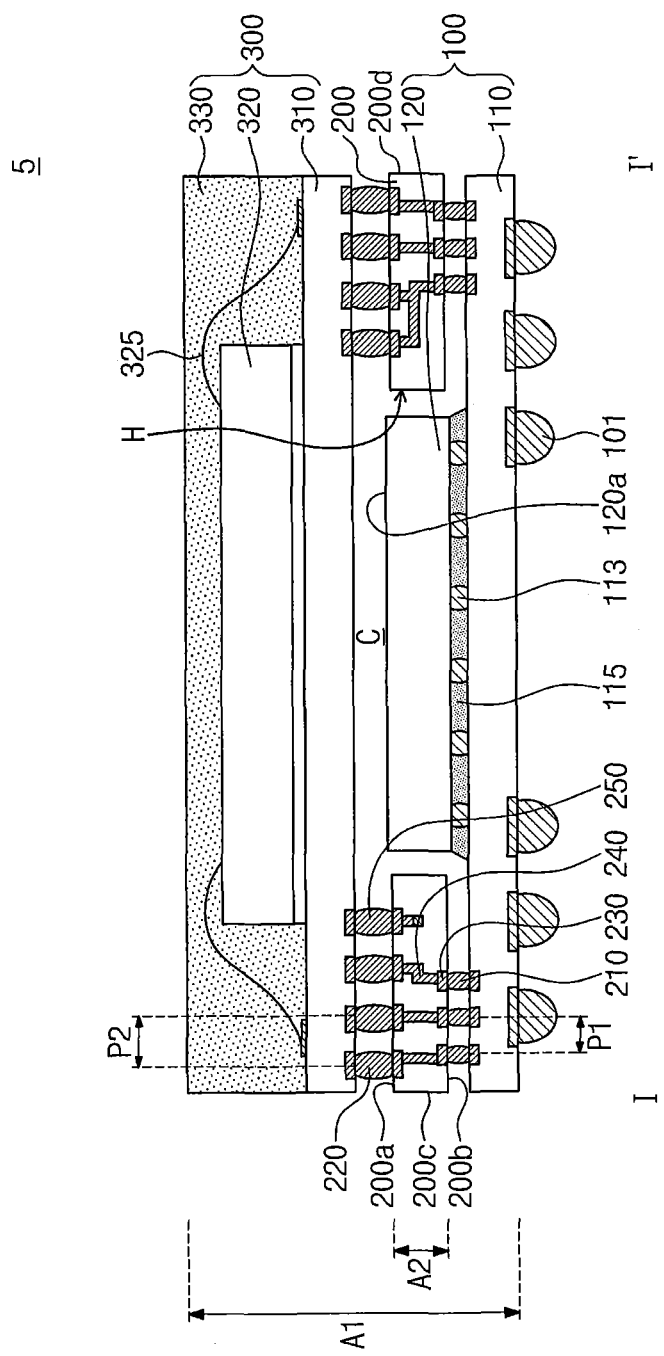
FIGS. 4A and 4B are sectional views respectively illustrating semiconductor packages according to example embodiments of present inventive concepts.

FIG. 4A is a sectional view illustrating a semiconductor package according to example embodiments of present inventive concepts.

Referring to FIG. 4A, a semiconductor package 5 may include the lower package 100, the interposer substrate 200, and the upper package 300. The lower package 100 may include the lower substrate 110 and the lower semiconductor chip 120 previously described with reference to FIGS. 1A and 1B. The upper package 300 may include the upper substrate 310, the upper semiconductor chip 320, and the upper mold layer 330. When viewed in a plan view, the lower and upper connection terminals 210 and 220 may be disposed to have substantially the same arrangement as one of those of FIGS. 1A and 3A through 3C.

The interposer substrate 200 may be provided to have the hole H and may be spaced apart from the lower semiconductor chip 120 in a lateral direction. The hole H may be configured to have substantially the same features as those of the examples of FIGS. 1A and 1B. The height A2 of the interposer substrate 200 may be controlled in such a way that the top surface 200a of the interposer substrate 200 is positioned at a desired vertical level. For example, the top surface 200a of the interposer substrate 200 may be positioned at a lower level than the top surface 120a of the lower semiconductor chip 120. Accordingly, the semiconductor package 5 may have substantially the same height (e.g., A1) as that of a semiconductor package in which the interposer substrate 200 is not provided. In certain embodiments, the height A2 of the interposer substrate 200 may be controlled to reduce the height A1 of the semiconductor package 5, and this makes it possible to further reduce a size of the semiconductor package 5.

Figure 4B:
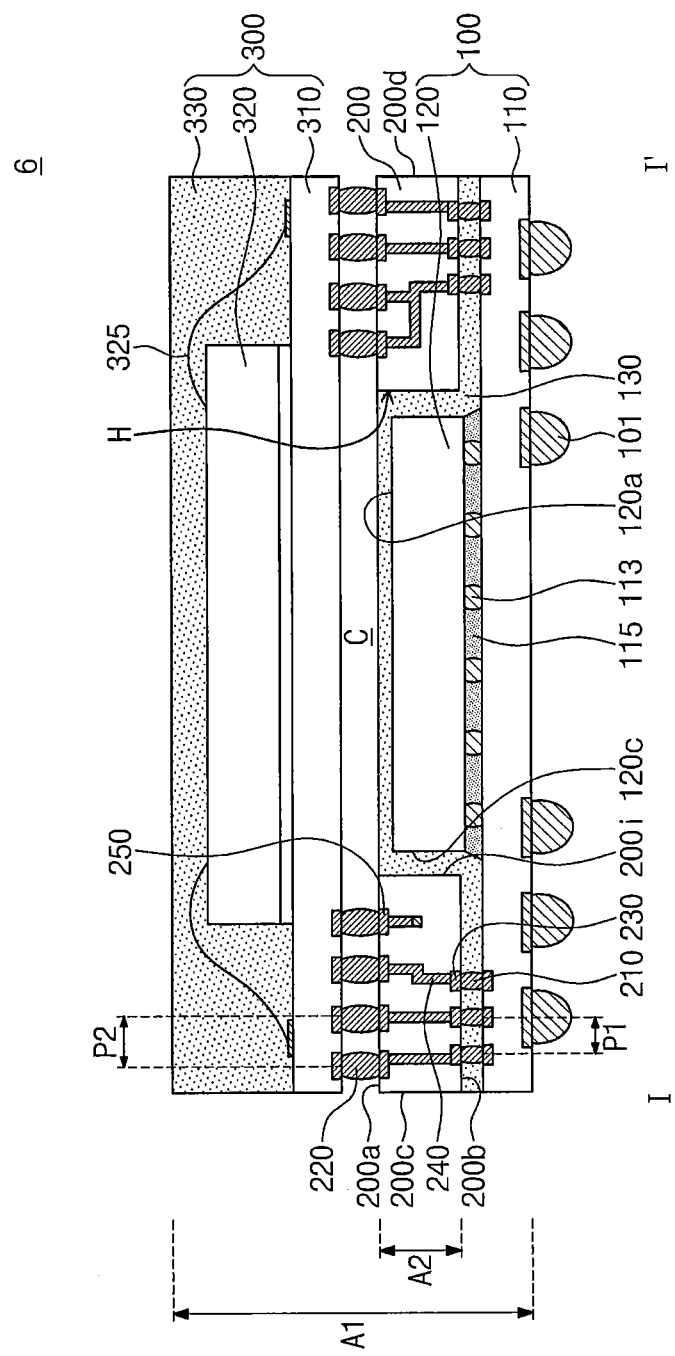

FIG. 4B is a sectional view illustrating a semiconductor package according to example embodiments of present inventive concepts. For the sake of brevity, the elements and features of this example that are similar to those previously shown and described may not be described further or in much further detail.

Referring to FIG. 4B, a semiconductor package 6 may include the lower package 100, the interposer substrate 200, and the upper package 300. The lower package 100 may include the lower substrate 110 and the lower semiconductor chip 120 previously described with reference to FIGS. 1A and 1B. The upper package 300 may include the upper substrate 310, the upper semiconductor chip 320, and the upper mold layer 330. When viewed in a plan view, the lower and upper connection terminals 210 and 220 may be disposed to have substantially the same arrangement as one of those of FIGS. 1A and 3A through 3C.

A lower mold layer 130 may be provided on the lower substrate 110 to cover the lower semiconductor chip 120. The lower mold layer 130 may include a portion provided between a sidewall 120c of the lower semiconductor chip 120 and an inner sidewall 200i of the interposer substrate 200. As another example, the lower mold layer 130 may be provided to cover the sidewall 120c of the lower semiconductor chip 120 and the inner sidewall 200i of the interposer substrate 200 and to expose the top surface 120a of the lower semiconductor chip 120. The lower mold layer 130 may be extended to fill a gap region between the lower substrate 110 and the interposer substrate 200 and between the lower connection terminals 210. As another example, the under fill layer 115 may not be provided in the semiconductor package 6, and the lower mold layer 130 may be extended to fill a gap region between the lower substrate 110 and the lower semiconductor chip 120 and between the connecting portions 113.

Figure 5:
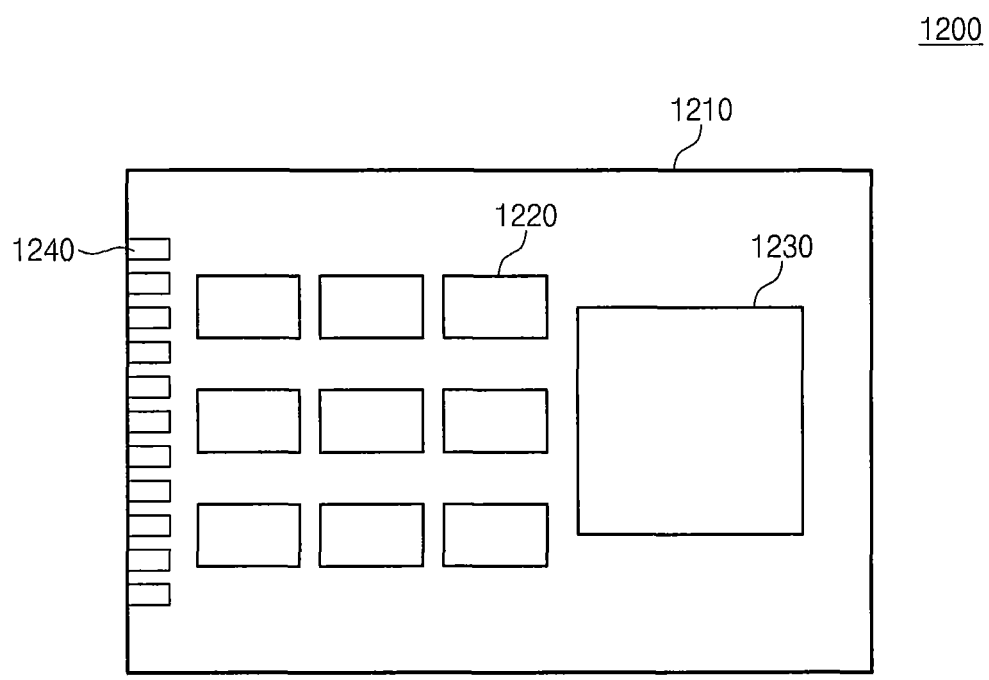
FIG. 5 is a diagram illustrating an example of package modules including a semiconductor package according to example embodiments of present inventive concepts.
Figure 6:
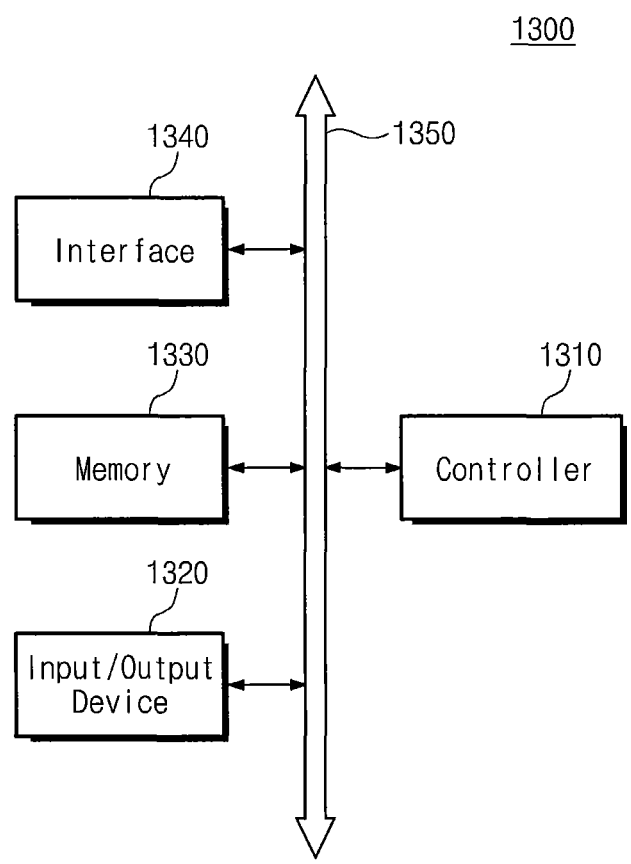
FIG. 6 is a block diagram illustrating an example of electronic systems including a semiconductor package according to example embodiments of present inventive concepts.
Figure 7:
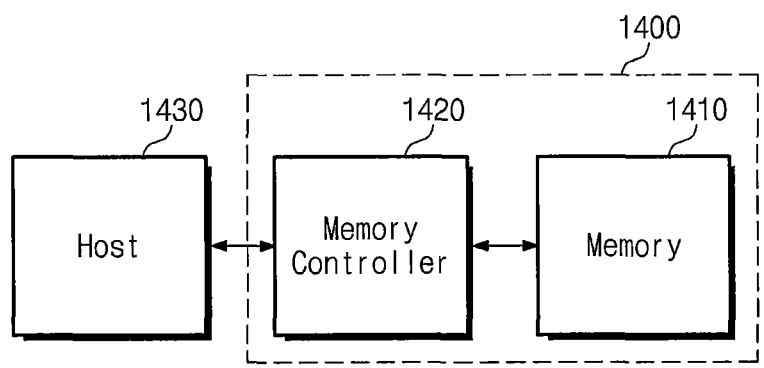
FIG. 7 is a block diagram illustrating an example of memory cards including a semiconductor package according to example embodiments of present inventive concepts.

FIG. 5 is a diagram illustrating an example of package modules including a semiconductor package according to example embodiments of present inventive concepts. FIG. 6 is a block diagram illustrating an example of electronic systems including a semiconductor package according to example embodiments of present inventive concepts. FIG. 7 is a block diagram illustrating an example of memory cards including a semiconductor package according to example embodiments of present inventive concepts.

Referring to FIG. 5, a package module 1200 may include semiconductor devices 1220 and a semiconductor device 1230 packaged in, for example, a quad flat package (QFP) type. The semiconductor devices 1220 and 1230 may be configured to include at least one of semiconductor packages 1 to 6 according to example embodiments of present inventive concepts. The package module 1200 may be connected to an external electronic device through an external connection terminal 1240 disposed at one side of a package substrate 1210.

Referring to FIG. 6, an electronic system 1300 may include a controller 1310, an input/output (I/O) unit/device 1320, and a memory device 1330. The controller 1310, the I/O unit/device 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include at least one of the semiconductor packages 1 to 6 according to example embodiments of present inventive concepts. The I/O unit/device 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as a solid state disk (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate wirelessly or by cable. For example, the interface unit 1340 may include an antenna for wireless communication or a transceiver for cable communication. An application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 7, a memory system 1400 may include a non-volatile memory device 1410 and a memory controller 1420. The non-volatile memory device 1410 and the memory controller 1420 may store data or read stored data. The non-volatile memory device 1410 may include at least one non-volatile memory device, to which the semiconductor package technology according to example embodiments of present inventive concepts is applied. The memory controller 1420 may control the non-volatile memory device 1410 to read the stored data and/or to store data in response to read/write request of a host 1430.

According to example embodiments of present inventive concepts, an interposer substrate with a hole may be provided. The hole is formed to penetrate the interposer substrate, and a lower semiconductor chip may be provided on a lower substrate and in the hole of the interposer substrate. The interposer substrate may be spaced apart from the lower semiconductor chip; that is, the interposer substrate may not be provided on a top surface of the lower semiconductor chip. In other words, the use of the interposer substrate allows a semiconductor package to have a relatively small height and a small size.

The interposer substrate may be configured to connect upper connection terminals electrically to lower connection terminals. By using the interposer substrate, the lower connection terminals may be disposed to have a pitch smaller than that of the upper connection terminals. This makes it possible to relieve a technical limitation in configuring a circuit of each or both of the lower and upper substrates and diversify the structures of the lower and upper packages.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor package, comprising:
   a lower package comprising a lower substrate and a lower semiconductor chip on the lower substrate;
   an interposer substrate on the lower substrate and laterally spaced apart from the lower semiconductor chip, the interposer substrate comprising a first thickness that is unequal to a second thickness of the lower semiconductor chip;
   lower connection terminals between the lower substrate and the interposer substrate to electrically connect the lower substrate to the interposer substrate, the lower connection terminals comprising a first pitch;
   upper connection terminals on the interposer substrate and electrically connected to the interposer substrate, the upper connection terminals comprising a second pitch longer than the first pitch of the lower connection terminals; and
   an upper package on the interposer substrate and the lower semiconductor chip and electrically connected to the upper connection terminals, the upper package comprising an upper substrate and an upper semiconductor chip,
   wherein some of the upper connection terminals form m rows that are adjacent and parallel to a first outer side of the interposer substrate,
   wherein some of the lower connection terminals form n rows that are adjacent the first outer side of the interposer substrate,
   wherein m is greater than n, and
   wherein each of n and m is a natural number.

2. The semiconductor package of claim 1,
   wherein the interposer substrate comprises a hole penetrating therethrough,
   wherein the lower semiconductor chip is in the hole, and
   wherein the first pitch is smaller than 0.35 nanometers.

3. The semiconductor package of claim 1,
   wherein other ones of the upper connection terminals form a rows that are adjacent and parallel to a second outer side of the interposer substrate,
   wherein other ones of the lower connection terminals form b rows that are adjacent and parallel to the second outer side,
   wherein a is greater than or equal to b, and
   wherein each of a and b is a natural number.

4. The semiconductor package of claim 1, wherein the interposer substrate comprises a top surface that is farther, than a top surface of the lower semiconductor chip, from the upper package.

5. The semiconductor package of claim 1, further comprising a lower mold layer on the lower substrate to cover the lower semiconductor chip,
   wherein the lower mold layer comprises a portion interposed between a sidewall of the lower semiconductor chip and an inner sidewall of the interposer substrate.

6. The semiconductor package of claim 1, wherein the interposer substrate comprises interconnection lines electrically connecting the upper connection terminals to the lower connection terminals.

7. The semiconductor package of claim 1,
   wherein, when viewed in plan view, the lower semiconductor chip is on a middle portion of the lower substrate, and
   wherein the interposer substrate is on an edge of the lower substrate.

8. The semiconductor package of claim 1, wherein a first quantity of the upper connection terminals is different from a second quantity of the lower connection terminals.

9. A semiconductor package, comprising:
   a lower package comprising a lower substrate on which a lower semiconductor chip is mounted;
   an interposer substrate on the lower substrate and laterally spaced apart from the lower semiconductor chip;
   an upper package on the interposer substrate and the lower semiconductor chip, the upper package comprising an upper substrate on which an upper semiconductor chip is mounted;
   lower connection terminals on a bottom surface of the interposer substrate to electrically connect the lower substrate to the interposer substrate; and
   upper connection terminals on a top surface of the interposer substrate to electrically connect the interposer substrate to the upper substrate,
   wherein, when viewed in plan view, the upper connection terminals comprise a first arrangement different from a second arrangement of the lower connection terminals, and
   wherein a first quantity of the lower connection terminals in an outermost row of the lower connection terminals is greater than a second quantity of the upper connection terminals in an outermost row of the upper connection terminals.

10. The semiconductor package of claim 9,
    wherein the lower connection terminals comprise a first pitch different from a second pitch of the upper connection terminals, and
    wherein the first pitch is smaller than 0.35 nanometers.

11. The semiconductor package of claim 9,
    wherein the interposer substrate comprises a hole penetrating the interposer substrate and connecting the top surface to the bottom surface, and
    wherein the lower semiconductor chip is in the hole.

12. The semiconductor package of claim 11,
    wherein some of the upper connection terminals form m rows that are adjacent and parallel to a first side of the interposer substrate,
    wherein some of the lower connection terminals form n rows that are adjacent the first side of the interposer substrate,
    wherein m is greater than n, and
    wherein each of n and m is a natural number.

13. The semiconductor package of claim 12,
    wherein other ones of the upper connection terminals form a rows that are adjacent and parallel to a second side of the interposer substrate, wherein other ones of the lower connection terminals form b rows that are adjacent to the second side, wherein a is greater than b, and wherein each of a and b is a natural number.

14. The semiconductor package of claim 13, wherein the second side is opposite the first side.

15. The semiconductor package of claim 13, wherein the second side is connected to the first side.

16. The semiconductor package of claim 9, wherein the lower semiconductor chip and the interposer substrate are separated from the upper substrate by first and second distances, respectively, and wherein the first distance is shorter than the second distance.

17. The semiconductor package of claim 12, wherein one of the m rows comprises a third quantity of the upper connection terminals, wherein one of the n rows comprises a fourth quantity of the lower connection terminals, and wherein the fourth quantity is greater than the third quantity.

18. A semiconductor package, comprising:

a lower package comprising a lower substrate and a lower semiconductor chip mounted on the lower substrate;

an upper package comprising an upper substrate and an upper semiconductor chip mounted on the upper substrate;

an interposer substrate between the lower and upper substrates, the interposer substrate comprising a bottom surface comprising first pads thereon, a top surface comprising second pads, and a hole penetrating through the interposer substrate;

first connection terminals interposed between the lower substrate and the interposer substrate to electrically connect the first pads to the lower package, the first connection terminals comprising a first pitch of smaller than 0.35 nanometers; and second connection terminals interposed between the interposer substrate and the upper substrate to electrically connect the second pads to the upper package, the second connection terminals comprising a second pitch longer than the first pitch, wherein a first quantity of the first connection terminals in an outermost row of the first connection terminals is greater than a second quantity of the second connection terminals in an outermost row of the second connection terminals, and wherein the lower semiconductor chip is in the hole.

19. The semiconductor package of claim 18, wherein the first pads and the second pads are between a side of the interposer substrate and the hole to form rows parallel to the side, wherein the side connects the top surface to the bottom surface, and wherein a first quantity of the rows of the second pads is equal to or greater than a second quantity of the rows of the first pads.

* * * * *